United States Patent [19]

Takemae et al.

[11] Patent Number: 4,578,776

[45] Date of Patent: Mar. 25, 1986

[54] DYNAMIC SEMICONDUCTOR MEMORY DEVICE

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 555,891

[22] Filed: Nov. 28, 1983

[30] Foreign Application Priority Data

Dec. 1, 1982 [JP]  Japan ................................ 57-211146

[51] Int. Cl.$^4$ ............................................. G11C 11/24
[52] U.S. Cl. ...................................... 365/149; 365/189
[58] Field of Search ................ 365/149, 189, 190, 203

[56] References Cited

U.S. PATENT DOCUMENTS 4,259,729 3/1981 Tokushige ........................... 365/149
4,458,336 7/1984 Takemae ............................. 365/149
4,477,886 10/1984 Au ................................... 365/203 X Primary Examiner—Joseph A. Popek
Attorney, Agent, or Firm—Staas & Halsey

[57] ABSTRACT

A dynamic semiconductor memory device includes a one-transistor one-capacitor type dynamic memory cell and a voltage dividing circuit having a potential providing terminal for providing an intermediate potential between the potential of the power supply and ground potential. One electrode of the capacitor in the memory cell is connected to the potential providing terminal. The voltage dividing circuit includes a potential switching circuit which changes the intermediate potential synchronously with an internal clock signal for selecting a word line, thus preventing a read error.

16 Claims, 10 Drawing Figures

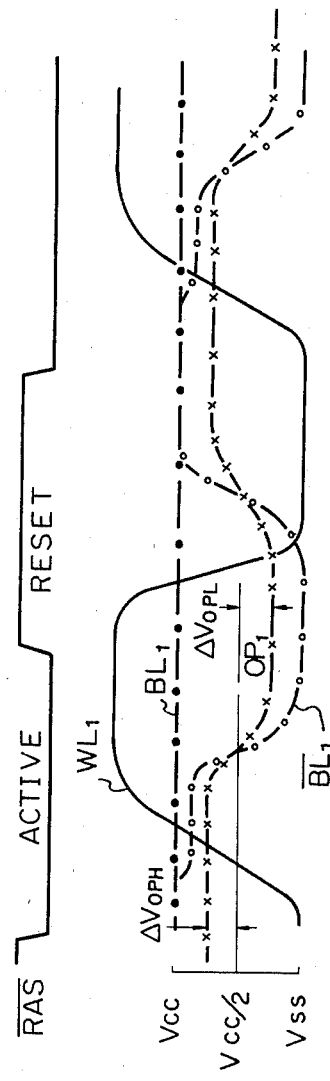
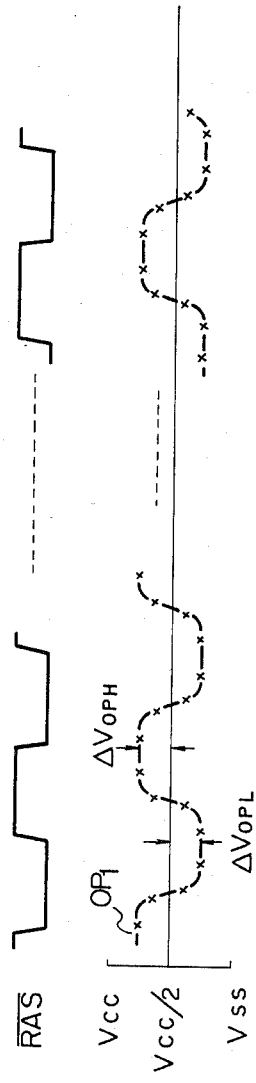
Fig. 2A PRIOR ART
Fig. 2B PRIOR ART

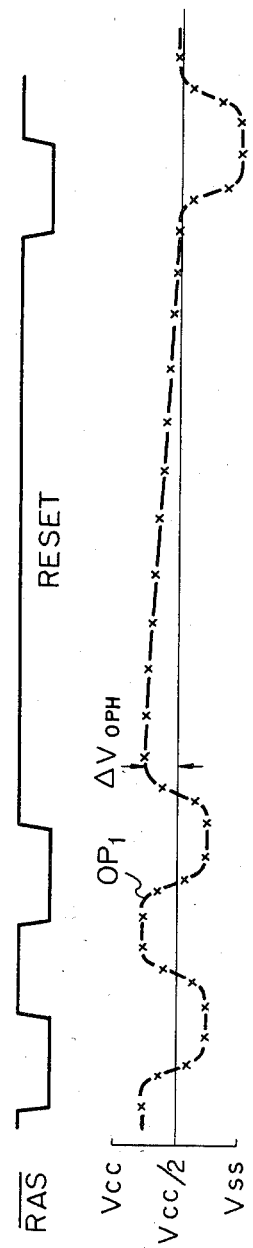
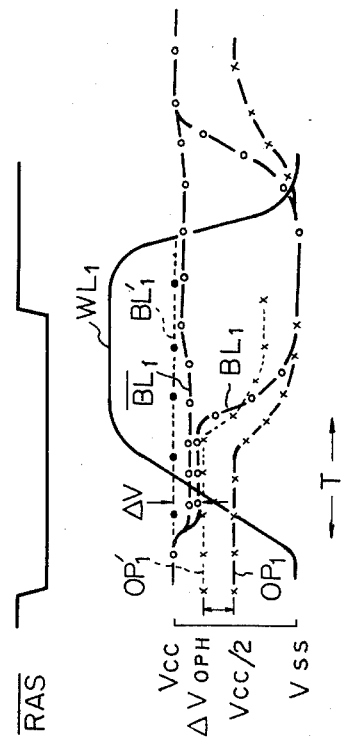
Fig. 3A PRIOR ART
Fig. 3B

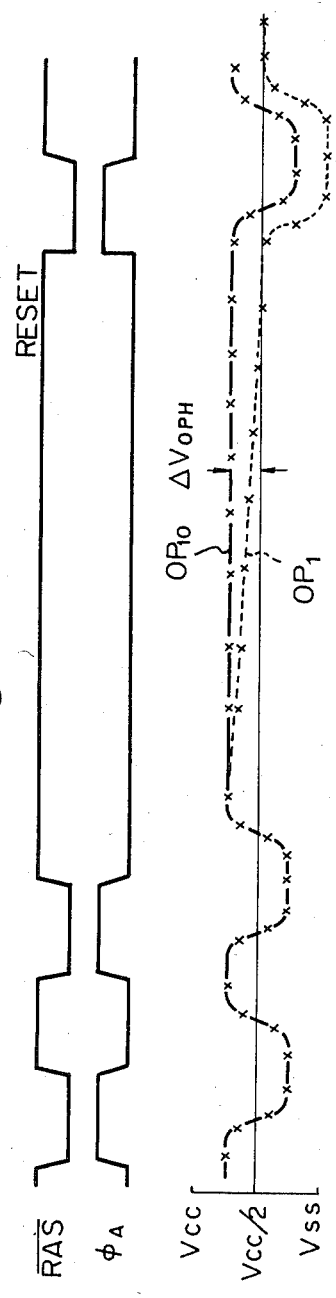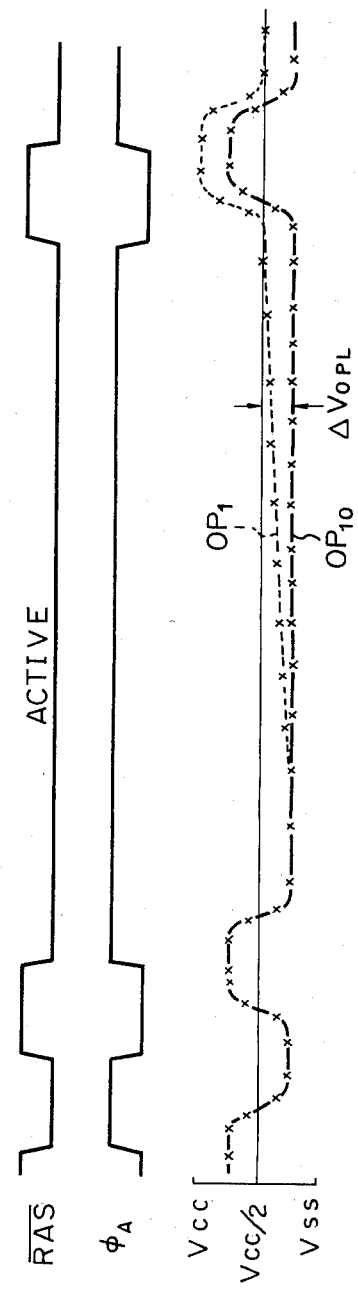

DYNAMIC SEMICONDUCTOR MEMORY DEVICE

BACKGROUND OF THE INVENTION

1. Field of the Invention

The present invention relates to a dynamic semiconductor memory device, and more particularly to a voltage dividing circuit in a one-transistor one-capacitor type dynamic semiconductor memory device for providing a switchable voltage to an electrode of the capacitor, to prevent errors during reading operations.

2. Description of the Prior Art

In general, a one-transistor one-capacitor type dynamic random access memory (RAM) includes one metal insulator semiconductor (MIS) transistor and one capacitor for each memory cell. The capacitor has one electrode connected to the transistor. The other electrode of the capacitor electrode (hereinafter referred to as the opposite electrode) was, in the earliest embodiments of this type of memory, connected to a power supply line or a ground line. Presently, however, the opposite electrode is usually connected to a point having a potential half that of the power supply potential $V_{CC}$ of the power supply line. The reason for connecting the opposite electrode to a point having the potential $V_{CC}/2$ is as follows. Accompanied by recent improvements in the integration density of such semiconductor memory devices, the area of the electrodes of the capacitor in the memory cell has been more and more decreased. In order to obtain the desired capacitance with a capacitor having such a small area, the thickness of the insulating film between the electrodes of the capacitor is made thin. Because the insulating film is thin, the voltage tolerance of the insulating film is lowered. Therefore, the voltage applied between the electrodes of the capacitor is preferably small and is set to $V_{CC}/2$ rather than $V_{CC}$.

The present invention starts with such a conventional dynamic RAM as described above in which the opposite electrode of the capacitor in each memory cell is connected to a point having the potential $V_{CC}/2$. Two resistors are conventionally used for providing the potential $V_{CC}/2$. That is, two resistors having the same resistance are connected in series between the power supply line and the ground line so as to provide the potential $V_{CC}/2$ at the function between the two resistors, and the opposite electrode of the capacitor in each memory cell is connected to the function between the resistors. In this construction, however, the potential of the opposite electrode fluctuates in response to internal clock signals or operation of the memory device due to parasitic capacitance in the memory device as described later in detail with reference to the drawings. Because countermeasures for the potential fluctuations of the opposite electrode are not provided in the conventional dynamic RAM, read errors often occur, as described later in detail.

SUMMARY OF THE INVENTION

Accordingly, an object of the present invention is to provide a dynamic semiconductor memory device having one transistor and one capacitor in each memory cell, in which a voltage dividing circuit is provided for switching the potential applied to the opposite electrode of the capacitor in accordance with the fluctuations in the potential of the opposite electrode due to parasitic capacitances in the memory device.

Another object of the present invention is to provide such a memory device as above, in which an error in a read operation due to the fluctuation in the potential of the opposite electrode is prevented.

Still another object of the present invention is to provide such a memory device as above, in which, during a reset interval and during an active interval of an internal clock signal, the potentials applied to the opposite electrode of the capacitor are different.

To attain the above objects, according to the present invention, there is provided a dynamic semiconductor memory device including a one-transistor one-capacitor type dynamic memory cell and a voltage dividing circuit having a potential providing terminal for providing an intermediate potential between the potential of a power supply and ground potential. The one-transistor one-capacitor type dynamic memory cell includes a single transistor and a single capacitor. The transistor has a gate electrode connected to a word line and has two other electrodes. The capacitor has a first electrode and a second electrode opposite to the first electrode. The first electrode is connected to one of the other electrodes of the transistor, and the second electrode is connected to the potential providing terminal of the voltage dividing circuit. Further, the voltage dividing circuit includes a potential switching circuit for changing the intermediate potential in synchronism with an internal clock signal or the operation of the memory device.

According to one embodiment of the present invention, the voltage dividing circuit includes a first resistor and a second resistor connected in series between a power supply line and a ground line. The potential switching circuit in the voltage dividing circuit includes a third resistor and a switching transistor having a control electrode and first and second other electrodes. One end of the third resistor is connected to a junction between the first resistor and the second resistor and the other end of the third resistor is connected to the first other electrodes of the switching transistor. The second electrode of the switching transistor is connected to the ground line or the power supply line and the junction is the potential providing terminal.

According to another embodiment of the present invention, the voltage dividing circuit includes a first resistor and a second resistor connected in series between a power supply line and a ground line, a third resistor and a fourth resistor connected in series between the power supply line and the ground line, a first switching transistor having a first control electrode for turning on or off the first switching transistor and first and second electrodes, and a second switching transistor having a second control electrode for turning on or off the second switching transistor and third and fourth electrodes. The first electrode of the first switching transistor is connected to a first junction between the first resistor and the second resistor and the third electrode of the second switching transistor is connected to a second junction between the third resistor and the fourth resistor. The second electrode of the first switching transistor and the fourth electrode of the second switching transistor are commonly connected to the potential providing terminal. The first control electrode operatively receives a first internal clock signal and the second control electrode operatively receives a second internal clock signal having a phase difference of 180° with respect to the phase of the first internal clock signal.

BRIEF DESCRIPTION OF THE DRAWINGS

The above objects and features of the present invention will be more apparent from the following description of the preferred embodiments of the present invention in comparison with the conventional device, with reference to the accompanying drawings, wherein:

FIG. 2A is a waveform diagram depicting a normal operation of the circuit illustrated in FIG. 1;

FIG. 2B is a waveform diagram of a series of intervals of the waveform illustrated in FIG. 2A;

FIG. 3A is a waveform diagram depicting an abnormal operation of the circuit illustrated in FIG. 1;

FIG. 3B is a waveform diagram depicting an error in a read operation of the circuit illustrated in FIG. 1;

FIG. 5A is a waveform diagram depicting the operation of the circuit illustrated in FIG. 4 when a reset interval is longer than an active interval;

FIG. 5B is a waveform diagram depicting the operation of the circuit illustrated in FIG. 4 when an active interval is longer than a reset interval;

DESCRIPTION OF THE PREFERRED EMBODIMENTS

Figure 1:
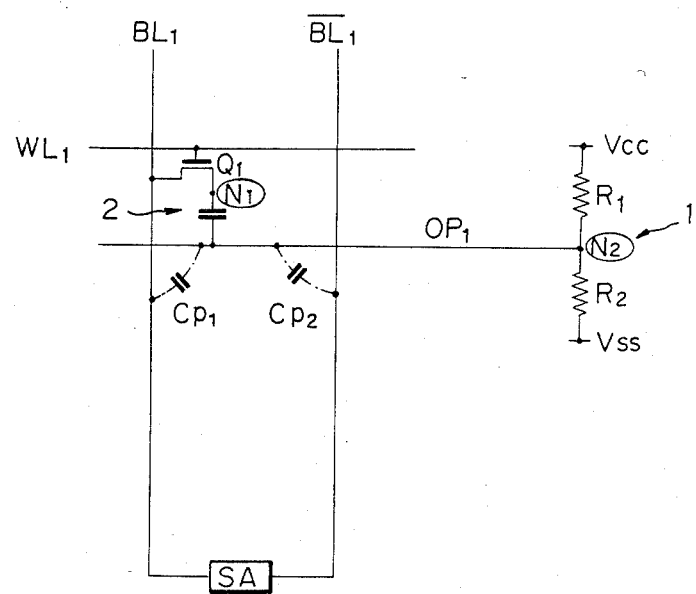
FIG. 1 is a circuit diagram of a part of a conventional dynamic RAM.

Before describing the preferred embodiments, a conventional example and the problems therein will first be described with reference to FIGS. 1, 2A, 2B, 3A and 3B. In FIG. 1, a conventional dynamic RAM comprises a voltage dividing circuit 1 providing the potential $V_{CC}/2$, and a memory cell 2 consisting of a metal-oxide semiconductor (MOS) transistor $Q_1$ and a capacitor $C_1$. The gate of the MOS transistor $Q_1$ is connected to a word line $WL_1$. One of the other two electrodes (source or drain) of the MOS transistor $Q_1$ is connected via a node $N_1$ to one electrode of the capacitor $C_1$. The other electrode of the MOS transistor $Q_1$ is connected to a bit line $BL_1$. The bit line $BL_1$ and a bit line $\overline{BL}_1$ constitute a bit line pair. A sense amplifier SA is connected between the bit lines $BL_1$ and $\overline{BL}_1$. A dummy memory cell (not shown) for storing reference information used when the memory cell 2 is read is connected to the bit line $\overline{BL}_1$. The voltage dividing circuit 1 consists of two resistors $R_1$ and $R_2$ connected in series between a power supply line $V_{CC}$ and a ground line $V_{SS}$. The resistors $R_1$ and $R_2$ have the same resistance therefore a junction or connecting point $N_2$ between them provides the potential $V_{CC}/2$, where $V_{CC}$ is the voltage between the power supply line $V_{CC}$ and the ground line $V_{SS}$. The other electrode (opposite electrode) of the capacitor $C_1$ and the opposite electrodes of the other capacitors (not shown) in other memory cells are commonly connected to an opposite electrode line $OP_1$ which is connected to the connecting point $N_2$ between the resistors $R_1$ and $R_2$.

Since the opposite electrode line $OP_1$ is common to a number of capacitors in the memory cells, it has a relatively large area. Therefore, there are relatively, large parasitic capacitances between the opposite electrode line $OP_1$ and the bit line $BL_1$, bit line $\overline{BL}_1$, or the other nodes (not shown). In the figure, only the parasitic capacitances $CP_1$ and $CP_2$ are indicated for the sake of simplicity, but in practice, there are more parasitic capacitances between the opposite electrode line $OP_1$ and the other nodes. In order to keep the potential at the opposite electrode line $OP_1$ to $V_{CC}/2$, the time constant derived from the resistances (also referred to as $R_1$ and $R_2$) in the voltage dividing circuit 1 and the parasitic capacitors, for example, $CP_1$ and $CP_2$, is preferably as small as possible. However, even when the memory device is unselected, that is, even during a reset interval, a current flows through the resistors $R_1$ and $R_2$. Therefore, if the resistances $R_1$ and $R_2$ are made small for obtaining a small time constant, a relatively large amount of power is consumed in the resistors $R_1$ and $R_2$. To prevent the large power consumption, the resistors $R_1$ and $R_2$ are usually made with high resistances. Because of the high resistances, the time constant is inevitably large.

When the time constant is relatively large, the potential at the opposite electrode line $OP_1$ is not kept at the constant potential $V_{CC}/2$, as can be seen in FIGS. 2A, 2B, 3A, and 3B. FIG. 2A illustrates waveforms at some points in the dynamic RAM in FIG. 1. In FIG. 2A, a row address strobe ($\overline{RAS}$) causes the dynamic RAM to become active when it is at a low (L) level. When the $\overline{RAS}$ has the L level, the dynamic RAM is enabled to effect a read or write operation. More particularly, the dynamic RAM fetches address signals so that the potential of the selected word line $WL_1$ is raised, in response to the transition from the H to the L level of the $\overline{RAS}$. When the potential of the word line $WL_1$ is raised to a high level, the transistor $Q_1$ is turned on. Before the word line potential is raised, that is, during a reset interval when the $\overline{RAS}$ is at a high (H) level, both of the bit lines $BL_1$ and $\overline{BL}_1$ are precharged to have the potential $V_{CC}$. When the capacitor $C_1$ has been charged up, that is, when the capacitor $C_1$ is storing a data "1", the charge on the bit line $BL_1$ does not flow through the transistor $Q_1$ into the capacitor $C_1$ even after the transistor $Q_1$ is turned on, so that the potential of the bit line $BL_1$ is not changed by the rise of the potential of the word line $WL_1$, and some of the charge on the bit line $\overline{BL}_1$ flows into the dummy memory cell (not shown) so that the potential of the bit line $\overline{BL}_1$ is lowered. The sense amplifier SA detects and amplifies the potential difference between the bit lines $BL_1$ and $\overline{BL}_1$, so that the potential of the bit line $BL_1$ remains at $V_{CC}$ and the potential of the bit line $\overline{BL}_1$ is lowered to ground potential $V_{SS}$. In contrast to this, when the capacitor $C_1$ is storing a data "0", the opposite result is obtained. In the following, the capacitor $C_1$ is assumed to be storing the data "1".

Due to the lowered potential of the bit line $\overline{BL}_1$, some of the charge on the opposite electrode $OP_1$ flows into the parasitic capacitor $CP_2$ between the opposite electrode line $OP_1$ and the bit line $\overline{BL}_1$, causing the potential of the opposite electrode line $OP_1$ to be lower than $V_{CC}/2$ by a voltage $\Delta V_{OPL}$. That is, the parasitic capacitor $CP_2$ is charged up in such a manner that the electrode of the parasitic capacitor $CP_1$ on the side connected to the opposite electrode line $OP_1$ is positive. Then, when $\overline{RAS}$ changes to the H level, the status of the dynamic RAM is changed to the subsequent reset interval so that the bit lines $BL_1$ and $\overline{BL}_1$ are precharged to $V_{CC}$. Since the parasitic capacitor $CP_1$ has been charged up, the potential of the opposite electrode line OP$_1$ is boosted to be higher than V$_{CC}$/2 by a voltage ΔV$_{OPH}$. Thus, as previously mentioned, the potential of the opposite electrode line varies in response to $\overline{RAS}$.

Since the opposite electrode line OP$_1$ is connected to the node N$_2$ which provides the constant potential V$_{CC}$/2, the potential of the opposite electrode line OP$_1$ will become V$_{CC}$/2 after a sufficiently long time in the reset interval or in the active interval. This causes a problem, as later described in detail. If, however, the reset interval and the active interval are both relatively short, so that the potential V$_{CC}$/2−ΔV$_{OPL}$ or ΔV$_{CC}$/2+ΔV$_{OPH}$ is not substantially changed during each interval, and if the duty ratio between the reset interval and the active interval is constant during read operations, no problem is caused. FIG. 2B shows the waveforms of $\overline{RAS}$ and the potential of the opposite electrode line OP$_1$ when the dynamic RAM in FIG. 1 operates normally as described above. In FIG. 2B, a relatively long time period of operation is illustrated. Each reset interval is short and has the same time period as each active interval. In this case, ΔV$_{OPH}$=ΔV$_{OPL}$. The average potential of the opposite electrode line OP$_1$ is V$_{CC}$/2.

Now, a problem or disadvantage of the conventional dynamic RAM will be explained with reference to FIGS. 3A and 3B. FIG. 3B shows the waveforms of $\overline{RAS}$ and the potential of the opposite electrode line OP$_1$ when one of the reset intervals is relatively long. As mentioned before, the potential of the opposite electrode line OP$_1$ decreases from V$_{CC}$/2+ΔV$_{OPH}$ to V$_{CC}$/2 during the long reset interval, as illustrated. Therefore, at the beginning of the active interval followed by the long reset interval, the potential at the opposite electrode line OP$_1$ is V$_{CC}$/2 instead of V$_{CC}$+ΔV$_{OPH}$.

FIG. 3B shows waveforms similar to those in FIG. 2A. The difference between FIG. 2A and FIG. 3B is that, in FIG. 3B, the potential of the opposite electrode line OP$_1$ at the beginning of an active interval is V$_{CC}$/2 instead of V$_{CC}$+ΔV$_{OPH}$. Referring to FIGS. 1 and 3B, if the potential of the opposite electrode line OP$_1$ at the beginning of the active interval is V$_{CC}$/2+ΔV$_{OPH}$, as is the case in FIG. 2A, the potential at the node N$_1$ is V$_{CC}$. However, if the potential of the opposite electrode line OP$_1$ at the beginning of the active interval is lowered to V$_{CC}$/2, as shown in FIG. 3A, it causes the potential at the node N$_1$ to be lowered from V$_{CC}$. As a result, a significant amount of charge on the bit line BL$_1$, which has been precharged to V$_{CC}$, flows through the transistor Q$_1$ into the capacitor C$_1$, so that the potential of the bit line BL$_1$ is lowered from V$_{CC}$ to a potential V$_{CC}$−ΔV which is lower than the lowered potential of the bit line $\overline{BL_1}$ at the beginning of the sensing operation. Thus, during an interval T, the sense amplifier SA erroneously detects that the potential of the bit line BL$_1$ is lower than the potential of the bit line $\overline{BL_1}$ although the capacitor C$_1$ is storing a data "1". The sense amplifier SA amplifies the potential difference between the bit lines BL$_1$ and $\overline{BL_1}$ so that the potential of the bit line BL$_1$ becomes the ground potential V$_{SS}$ and the potential of the bit line $\overline{BL_1}$ becomes the power supply potential V$_{CC}$. This results in a read error.

Even if the potential of the bit line BL$_1$ is not lowered much below the potential of the bit line $\overline{BL_1}$ during the interval T, i.e., the potential difference between the bit lines BL$_1$ and $\overline{BL_1}$ is very small, smaller than, for example, 50 milivolts, the sense amplifier, which can only detect a potential difference greater than, for example, 50 milivolts, may also produce a read error. In FIG. 3B, for easy comparision, the waveforms of the bit line BL$_1$' and the opposite electrode line OP$_1$' represent the normal operation shown in FIG. 2A.

According to the present invention, the above-described read error in the conventional dynamic RAM is prevented by providing an improved voltage dividing circuit, which outputs V$_{CC}$/2+Δ$_{OPH}$ during a reset interval and outputs V$_{CC}$/2−Δ$_{OPL}$ during an active interval.

Figure 4:
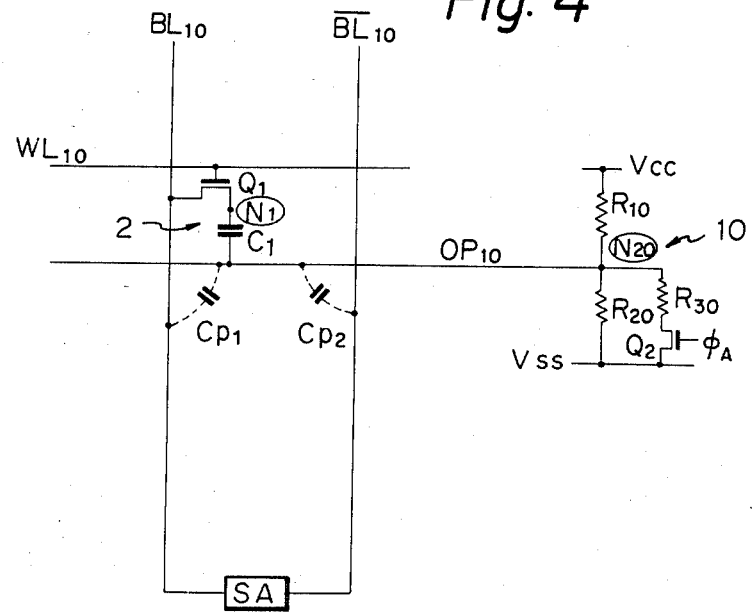
FIG. 4 is a circuit diagram of a part of a dynamic RAM, according to an embodiment of the present invention.

Embodiments of the present invention will be now described with reference to FIGS. 4, 5A, 5B and 6. FIG. 4 is a circuit diagram of a part of a dynamic RAM, according to an embodiment of the present invention. The difference between the conventional circuit in FIG. 1 and the circuit in FIG. 4 resides in the voltage dividing circuit. That is, in FIG. 4, a voltage dividing circuit 10 consists of resistors R$_{10}$ and R$_{20}$ connected in series between the power supply line V$_{CC}$ and the ground line V$_{SS}$, a resistor R$_{30}$, and a MOS transistor Q$_2$. The resistor R$_{30}$ and the MOS transistor Q$_2$ comprise a potential switching circuit. One end of the resistor R$_{30}$ is connected to a connecting point or function N$_{20}$ between the resistors R$_{10}$ and R$_{20}$. The connecting point N$_{20}$ is the potential providing terminal of the voltage dividing circuit 10. The other end of the resistor R$_{30}$ is connected to the drain of the MOS transistor Q$_2$. The source of the MOS transistor Q$_2$ is connected to the ground line V$_{SS}$. The gate of the MOS transistor Q$_2$ operatively receives a clock signal $\phi_A$ which is synchronized with $\overline{RAS}$, so that the MOS transistor Q$_2$ is substantially in an on state during an active interval and is substantially off during a reset interval. That is, the clock signal $\phi_A$ has the H level during active intervals and the L level during reset intervals.

This clock signal $\phi_A$ may be delayed with respect to $\overline{RAS}$ by a relatively short period of time if it is negligible as compared to the time constant of the voltage dividing circuit 10. Such a delay is even preferable if it makes the clock signal $\phi_A$ completely synchronized with the change of the potential of the opposite electrode line OP$_{10}$.

When the transistor Q$_2$ is in an off state, that is, during a reset interval, the potential V$_{N20}$ of the potential providing terminal N$_{20}$ is determined only by the resistors R$_{10}$ and R$_{20}$ i.e., $$V_{N20} = \frac{R_{20}}{R_{10} + R_{20}} V_{CC}.$$

The resistances of the resistors R$_{10}$ and R$_{20}$ are selected to satisfy the following expression (1):

$$\frac{R_{20}}{R_{10} + R_{20}} V_{CC} = \frac{1}{2} V_{CC} + \Delta V_{OPH} \tag{1}$$

where R$_{10}$ and R$_{20}$ represent the resistances of the resistors R$_{10}$ and R$_{20}$, respectively. At the beginning of the reset interval, the potential of the opposite electrode line OP$_{10}$ is V$_{CC}$+ΔV$_{OPH}$, as described before in the explanation of the conventional dynamic RAM. Therefore, the potential of the opposite electrode line OP$_{10}$ is fixed at V$_{CC}$/2+ΔV$_{OPH}$ during the reset interval.

When the transistor Q$_2$ is in an on state, that is, during an active interval, the potential V$_{N20}$ of the potential providing terminal N$_{20}$ is determined by the resistors $R_{10}$, $R_{20}$ and $R_{30}$. When resistance of the resistor $R_{30}$ is also expressed by $R_{30}$, $$V_{N20} = \frac{R_4}{R_{10} + R_4} V_{CC}, \text{ where } R_4 = \frac{R_{20} R_{30}}{R_{20} + R_{30}}. \quad$$

The resistance of the resistor $R_{30}$ is selected to satisfy the following expression (2):

$$\frac{R_4}{R_{10} + R_4} V_{CC} = \frac{1}{2} V_{CC} - \Delta V_{OPL} \quad (2)$$

At the beginning of the active interval, the potential of the opposite electrode line $OP_{10}$ is $V_{CC} - \Delta V_{OPL}$, as described before. Therefore, the potential of the opposite electrode line $OP_{10}$ is fixed at $V_{cc}/2\Delta V_{OPL}$ during the active interval. The voltages $\Delta V_{OPH}$ and $\Delta V_{OPL}$ in expressions (1) and (2) are experimentally determined. From the above expression (1), it is apparent that the resitance $R_{10}$ is smaller than the resistance $R_{20}$. From the above expression (2), it is apparent that the resistance $R_4$ is smaller than the resistance $R_{10}$.

FIG. 5A shows the waveforms of $\overline{RAS}$, the clock signal $\phi_A$ and the potential of the opposite electrode line $OP_{10}$ when a reset interval is longer than an active interval. As can be seen, the potential of the opposite electrode line $OP_{10}$ is not decreased from $V_{CC}/2 + \Delta V_{OPH}$ to $V_{CC}/2$ but is fixed at $V_{CC}/2 + \Delta V_{OPH}$ during the reset interval. In FIG. 5A, $OP_1$ represents the potential of the opposite electrode line $OP_1$ in the conventional dynamic RAM shown in FIG. 1, for easy comparison.

FIG. 5B shows the waveforms of $\overline{RAS}$ and the opposite electrode line $OP_{10}$ when an active interval is longer than a reset interval. As can be seen, the potential of the opposite electrode line $OP_{10}$ is not increased from $V_{CC}/2 - \Delta V_{OPL}$ to $V_{CC}/2$ but is fixed at $V_{CC}/2 - \Delta V_{OPL}$ during the reset interval.

Even when the duty ratio between the active interval and the reset interval is not constant, the potential of the opposite electrode line $OP_{10}$ is always constant in each interval. As a result, according to the embodiment shown in FIG. 4, the potential at the node $N_1$, and therefore, at the bit line $BL_{10}$, does not change during a sense operation and thus, a read error is prevented.

Figure 6:
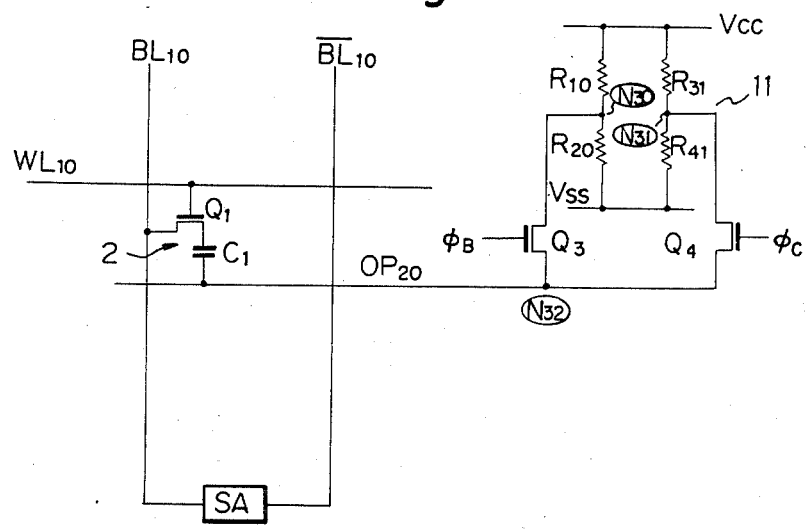
FIG. 6 is a circuit diagram of a part of a dynamic RAM, according to another embodiment of the present invention.

FIG. 6 is a circuit diagram of a part of a dynamic RAM, according to another embodiment of the present invention. The difference between FIG. 4 and FIG. 6 resides in the voltage dividing circuit 11. That is, in FIG. 6, the voltage dividing circuit 11 comprises resistors $R_{10}$ and $R_{20}$ connected in series between the power supply line $V_{CC}$ and the ground line $V_{SS}$, resistors $R_{31}$ and $R_{41}$ connected in series between the power supply line $V_{CC}$ and the ground line $V_{SS}$, and two MOS transistors $Q_3$ and $Q_4$. The drain of the MOS transistor $Q_3$ is connected to a connecting point or junction $N_{30}$ between the resistors $R_{10}$ and $R_{20}$, and the drain of the MOS transistor $Q_4$ is connected to a connecting point or function $N_{31}$ between the resistors $R_{31}$ and $R_{41}$. The sources of the transistors $Q_3$ and $Q_4$ are commonly connected to a potential providing terminal $N_{32}$ which is connected to the opposite electrode line $OP_{20}$. The gate of the transistor $Q_3$ operatively receives a clock signal $\phi_B$ which is synchronized with $\overline{RAS}$ so that the MOS transistor $Q_3$ is substantially in an on state during a reset interval and is substantially off during an active interval. That is, the clock signal $\phi_B$ is a signal which has the H level during reset intervals and the L level during active intervals. The gate of the transistor $Q_4$ operatively receives a clock signal $\phi_C$ which has a phase offset by 180° with respect to the phase of the clock signal $\phi_B$. Therefore, the MOS transistor $Q_4$ is substantially in on state during an active intervals and is substantially in an off state during reset intervals. The resistances of the resistors $R_{10}$ and $R_{20}$ are selected to satisfy the expression (1) described before. The resistances of the resistors $R_{31}$ and $R_{41}$ are selected to satisfy the following expression:

$$\frac{R_{41} V_{CC}}{R_{31} + R_{41}} = \frac{1}{2} V_{CC} - \Delta V_{OPL} \quad (3)$$

In the embodiment of FIG. 6, the change in potential at the potential providing terminal $N_{32}$ in response to the clock signals $\phi_B$ and $\phi_C$ is effected rapidly compared to the voltage dividing circuit 10 in FIG. 4. This is because, in FIG. 4, the potential providing terminal $N_{20}$ is connected through the resistor $R_{30}$ to the drain of the transistor $Q_2$, and there exists a time constant derived from the resistance $R_{30}$ and the parasitic capacitance of the MOS transistor $Q_2$. Due to the time constant, the rise or fall of the potential of the opposite electrode line $OP_{10}$ is slightly delayed, although this delay is negligible. In contrast, in FIG. 6, since the drain of the transistor $Q_3$ is directly connected to the connecting point $N_{30}$ between resistors $R_{10}$ and $R_{20}$, and since the drain of the transistor $Q_4$ is directly connected to the connecting point $N_{31}$ between the resistors $R_{31}$ and $R_{41}$, the time constant is much smaller than that in the embodiment of FIG. 4.

Figure 7:
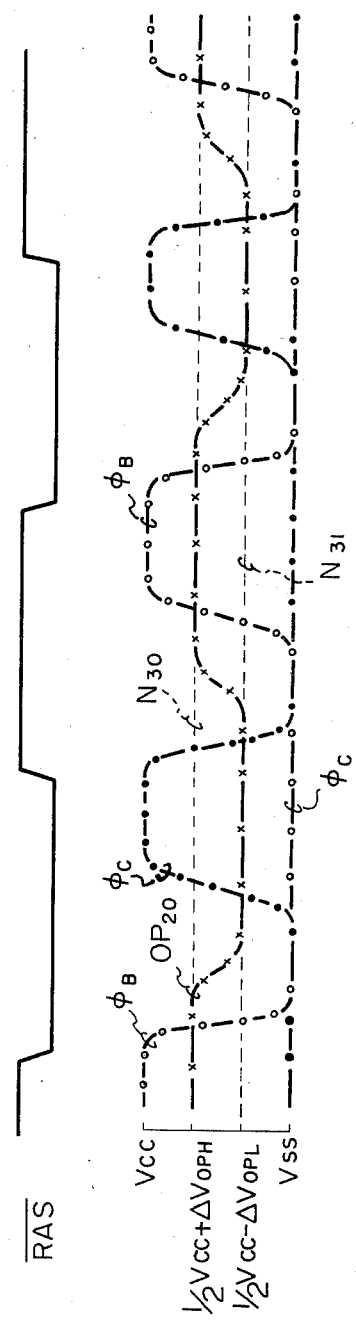
FIG. 7 is a waveform diagram depicting the operation of the circuit illustrated in FIG. 6.

FIG. 7 illustrates a detailed timing diagram for the clock signals $\phi_B$ and $\phi_C$ used in the circuit shown in FIG. 6. In FIG. 7, the potential of the opposite electrode line $OP_{20}$ changes between $V_{CC}/2 + \Delta OV_{OPH}$ and $V_{CC}/2 - V_{OPL}$ in the accordance with the operation of the memory device. The nodes $N_{30}$ and $N_{31}$ in the voltage dividing circuit 11 respectively generate the potential $V_{CC}/2 + \Delta V_{OPH}$ and $V_{CC}/2 - \Delta V_{OPL}$, by means of the resistors $R_{10}$ and $R_{20}$, and $R_{31}$ and $R_{41}$, respectively. In such a situation as above, the potential of the clock signal $\phi_C$ is raised to turn on the transistor $Q_4$ after the potential of the opposite electrode line $OP_{20}$ is substantially lowered to $V_{CC}/2 - \Delta V_{OPL}$. Then the potential of the clock signal $\phi_C$ is lowered to turn off the transistor $Q_4$ before the potential of the opposite electrode line $OP_{20}$ changes from $V_{CC}/2 - \Delta V_{OPL}$. Similarly, the potential of the clock signal $\phi_B$ is raised to turn on the transistor $Q_3$ after the potential of the opposite electrode line $OP_{20}$ substantially reaches $V_{CC}/2 + \Delta V_{OPH}$. Then the potential of the clock signal $\phi_B$ is lowered to turn off the transistor $Q_3$ before the potential of the opposite electrode line $OP_{20}$ changes. As a result, the transistors $Q_3$ and $Q_4$ are turned on only during intervals in which the potentials of the opposite electrode line $OP_{20}$ are $V_{CC}/2 + \Delta V_{OPH}$ and $V_{CC}/2 - \Delta V_{OPL}$, respectively.

In to the embodiment of FIG. 4, it is difficult to establish the timing for turning on or off of the transistor $Q_2$ because the change in the potential of the opposite electrode ine $OP_{10}$ between $V_{CC}/2 + \Delta V_{OPH}$ and $V_{CC}/2 - \Delta V_{OPL}$ is slow. However in the embodiment of FIG. 6, there is no such difficulty. The clock signals $\phi_A$ in FIG. 4, and $\phi_B$ and $\phi_C$ in FIG. 6 can be obtained by utilizing internal clock signals in the dynamic RAM which are synchronized with $\overline{RAS}$.

The resistors $R_{10}$, $R_{20}$, $R_{30}$, $R_{31}$ and $R_{41}$ in FIGS. 4 and 6 can be obtained by conventional techniques, that is, by using polycrystalline silicon film, depletion MOS transistors, or diffusion layers. The resistance of each resistor is on the order of, for example, 50 kΩ.

According to both embodiments, the potential of the opposite electrode line $OP_{10}$ or $OP_{20}$ is substantially held at to $V_{CC}/2+\Delta V_{OPH}$ and $V_{CC}/2-\Delta V_{OPL}$ during each reset interval and each active interval, respectively. The average potential of the opposite electrode line $OP_{10}$ or $OP_{20}$ for a long period is equal to $V_{CC}/2$, which is sufficiently low with respect to the tolerance voltage of the capacitor in each memory cell.

In the foregoing embodiments, the potential of the opposite electrode line $OP_{10}$ or $OP_{20}$ is raised higher than $V_{CC}/2$ at the beginning of each reset interval, and is lowered lower than $V_{CC}/2$ at the beginning of each active interval. The present invention, however, is not restricted to the above-mentioned case. That is, the opposite electrode line $OP_{10}$ or $OP_{20}$ forms parasitic capacitance with various nodes, for example bit lines $BL_1$ and $\overline{BL}_1$. Therefore, in response to changes in the potential at those nodes, the potential of the opposite electrode line $OP_{10}$ or $OP_{20}$ also fluctuates. The present invention is applicable to eliminate malfunctions caused by such fluctuations. Accordingly, the essense of the present invention lies in the design of the voltage dividing circuit 10 and 11 shown in FIG. 4 and FIG. 6, respectively, in which its outputs potential is changed in conformity with changes of the potential of the opposite electrode line $OP_{10}$ or $OP_{20}$ which is caused by and synchronized with the read or write operations of the device.

From the foregoing description, it will be apparent that, according to the present invention, by providing an improved voltage dividing circuit $OP_{10}$ or $OP_{20}$ for providing intermediate potentials between $V_{CC}$ and $V_{SS}$ in a dynamic semiconductor memory device, and since the voltage dividing circuit 10 or 11 can switch its output potential in accordance with the change of the potential of the opposite electrode in the capacitor $C_1$ in each memory cell, an error in a read operation in a dynamic semiconductor memory device can be prevented even when the cycle time is changed, or when the reset interval or the active interval is very long, or when the duty ratio between the reset interval and the active interval is changed.

We claim:

1. A dynamic semiconductor memory device, operatively connectable to a power supply potential, comprising:
   a word line;
   a bit line;
   a one-transistor one-capacitor type dynamic memory cell, comprising:
      a single transistor having a gate electrode operatively connected to said word line, a first electrode operatively connected to said bit line and a second electrode; and
      a capacitor having a first electrode operatively connected to the second electrode of said transistor and a second electrode; and
   a voltage dividing circuit, operatively connectable to the power supply potential, comprising:
      a potential providing terminal, operatively connected to the second electrode of said capacitor, for providing an intermediate potential between the power supply potential and ground; and
      a potential switching circuit, operatively connected to said potential providing terminal, for changing the intermediate potential in synchronism with the operation of said dynamic semiconductor memory device.

2. A dynamic semiconductor memory device as set forth in claim 1, wherein said potential switching circuit in said voltage dividing circuit changes the intermediate potential in conformity with changes in a potential of the second electrode of said capacitor.

3. A dynamic semiconductor memory device as set forth in claim 1, said device receiving a row address strobe signal,
   wherein said dynamic semiconductor memory device generates an internal clock signal in dependence upon the row address strobe signal which indicates alternate sequences of active and reset intervals for said dynamic semiconductor memory device, and
   wherein said potential switching circuit is operatively connected to receive the internal clock signal and the intermediate potential changes in synchronism with the intervals of operation of said dynamic semiconductor memory device.

4. A dynamic semiconductor memory device as set forth in claim 3, wherein said potential switching circuit in said voltage dividing circuit provides a first potential higher than one-half of the power supply potential by a first predetermined value during at least a part of each of the reset intervals, and provides a second potential lower than one-half of the power supply potential by a second predetermined value during at least a part of each of the active intervals.

5. A dynamic semiconductor memory device as set forth in claim 4, wherein said potential switching circuit comprises switching means, operatively connected to said potential providing terminal and to receive the internal clock signal, for switching the intermediate potential of said potential providing terminal from the first potential to the second potential.

6. A dynamic semiconductor memory device as set forth in claim 5,
   further comprising:
      a power supply line providing the power supply potential; and
      a ground line,
   wherein said voltage dividing circuit further comprises a first resistor and a second resistor operatively connected in series between the power supply line and the ground line, forming a junction therebetween, the junction of said first and second transistors operatively connected to said potential providing terminal, and
   wherein said potential switching circuit in said voltage dividing circuit comprises:
      a switching transistor having a control electrode for turning on and off said switching transistor, a first electrode operatively connected to the ground line and a second electrode; and
      a third resistor having a first end operatively connected to the junction between said first resistor and said second resistor and a second end operatively connected to the second electrode of said switching transistor.

7. A dynamic semiconductor memory device as set forth in claim 6, wherein said first resistor, said second resistor and said third resistor have resistance values which are selected to the cause changes in the intermediate potential of said potential providing terminal which coincide with changes in a potential of the second electrode of said capacitor caused by the operation of said dynamic semiconductor memory device.

8. A dynamic semiconductor memory device as set forth in claim 6, wherein said first and second resistors each have a resistance value, the resistance value of said first resistor is smaller than the resistance value of said second resistor, and said second resistor and said third resistor when connected in parallel have a resistance value which is smaller than the resistance value of said first resistor.

9. A dynamic semiconductor memory device as set forth in claim 6, wherein said potential switching circuit comprises a switching transistor operatively connected to said potential providing terminal and having a control electrode operatively connected to receive the internal clock signal, said switching transistor is substantially in an on state during the active interval and is substantially in an off state during the reset interval.

10. A dynamic semiconductor memory device as set forth in claim 1,
further comprising a power supply line providing the power supply potential and a ground line, wherein said dynamic semiconductor memory device generates first and second internal clock signals, having a 180° difference in phase, in synchronism with the operation of said dynamic semiconductor memory device, and
wherein said voltage dividing circuit comprises:
a first resistor and a second resistor operatively connected in series between the power supply line and the ground line, forming a first junction between said first and second resistors;
a third resistor and a fourth resistor operatively connected in series between the power supply line and the ground line, forming a second junction between said third and fourth resistors;
a first switching transistor having a control electrode operatively connected to receive the first internal clock signal for turning on or off said first switching transistor, a first electrode operatively connected to the first junction between said first resistor and said second resistor and a second electrode operatively connected to said potential providing terminal; and
a second switching transitor having a control electrode operatively connected to receive the second internal clock signal for turning on and off said second switching transistor, a first electrode operatively connected to the second junction and a second electrode operatively connected to said potential porviding terminal.

11. A dynamic semiconductor memory device as set forth in claim 10,
wherein said dynamic semiconductor memory device operates in active and reset intervals, and
wherein said first and second switching transistors are substantially in on and off states, respectively, during the reset intervals of said dynamic semiconductor memory device, and substantially in off and on states, respectively, during the active intervals of said dynamic semiconductor memory device.

12. A dynamic semiconductor memory device as set forth in claim 11, wherein said first, second, third and fourth resistors have resistance values and the resistance value of said first resistor is smaller than the resistance value of said second resistor, and the resistance value of said third resistor is greater than the resistance value of said fourth resistor.

13. A dynamic semiconductor memory device as set forth in claim 10,
wherein said dynamic semiconductor memory device operates in active and reset intervals, and
wherein aid first switching transistor is in an on state during part of the reset interval and said second switching transistor is in an on state during part of the active interval.

14. A dynamic semiconductor memory device, operatively connected to a power supply potential and to receive an external clock signal, having active and reset intervals of operation, said dynamic semiconductor memory device comprising:
a dynamic memory cell having a word line; and
voltage dividing means, operatively connected to said dynamic memory cell and connectable to the power supply potential, for dividing the potential of the power supply into an intermediate potential, having a first level greater than one-half of the power supply potential and a second level less than one-half of the power supply potential, in synchronism with the operation of said dynamic semiconductor memory device, said voltage dividing means comprising:
clock signal providing means, operatively connected to receive the external clock signal, for providing an internal clock signal in synchronism with the active and reset intervals;
first and second resistors operatively connected in series between the power supply potential and ground, forming a junction therebetween operatively connected to said dynamic memory cell;
a third resistor operatively connected to the junction between said first and second resistors; and
a switching transistor, operatively connected to said third resistor and ground and to receive the internal clock signal, for connecting said third resistor in parallel with said second resistor and disconnecting said third resistor in dependence upon the internal clock signal, the first level of the intermediate potential being generated at the junction between said first and second resistors when said third resistor is disconnected and the second level of the intermediate potential being generated at the junction between said first and second resistors when said third resistor is connected.

15. A dynamic semiconductor memory device, operatively connectable to a power supply potential and to receive an external clock signal and, having active and reset intervals of operation, said dynamic semiconductor memory device comprising:
a dynamic memory cell having a word line; and
voltage dividing means, operatively connected to said dynamic memory cell and connectable to the power supply potential, for dividing the potential of the power supply into an intermediate potential, having a first level greater than one-half of the power supply potential and a second level less than one-half of the power supply potential, in synchronism with the operation of said dynamic semiconductor memory device, said voltage dividing means comprising:
clock signal providing means, operatively connected to receive the external clock signal, for providing first and second internal clock signals in synchronism with the active and reset intervals, the second internal clock signal being 180° out of phase with the first internal clock signal;

first and second resistors operatively connected in series between the power supply potential and ground, forming a first junction therebetween providing the first level of the intermediate potential;

third and fourth resistors operatively connected in series between the power supply potential and ground, forming a second junction therebetween providing the second level of the intermediate potential;

a first switching transistor operatively connected to the first junction, to receive the first internal clock signal and to said dynamic memory cell; and a second switching transistor operatively connected to the second junction, to receive the second internal clock signal and to said first switching transistor, the intermediate potential being supplied at the connection of said first and second switching transistors.

16. A dynamic semiconductor memory device as recited in claim 15, wherein said first and second internal clock signals are generated such that said first switching transistor is substantially in an on state and said second switching transistor is substantially in an off state during only part of the reset interval, and said first switching transistor is substantially in an off state and said second switching transistor is substantially in an on state during only part of the active interval.

* * * * *

UNITED STATES PATENT AND TRADEMARK OFFICE
CERTIFICATE OF CORRECTION

PATENT NO. : 4,578,776
DATED : March 25, 1986
INVENTOR(S) : Takemae et al.

It is certified that error appears in the above-identified patent and that said Letters Patent is hereby corrected as shown below:

```
Column 1, line 49, "function" should be --junction--.
Column 2, line 40, "electrodes" should be --electrode--.
Column 3, line 55, resistance" should be --resistance,--.
Column 6, line 24, "function" should be --junction--.
Column 7, line 17, "Vcc/2 Δ VOPL" should be --Vcc/2-Δ VOPL--;
          line 58, "function" should be --junction--.
Column 8, line 3, "in on" should be --in an on--;
          line 4, delete "an";
          line 37, delete "the" (first occurrence);
          line 58, delete "to" (first occurrence);
          line 61, "ine" should be --line--.
Column 9, line 6, delete "to".
Column 11, line 51, "porviding" should be --providing--.
Column 12, line 5, "aid" should be --said--.
```

Signed and Sealed this

Fifth Day of August 1986

[SEAL]

Attest:

DONALD J. QUIGG

Attesting Officer

Commissioner of Patents and Trademarks